Figure 1:
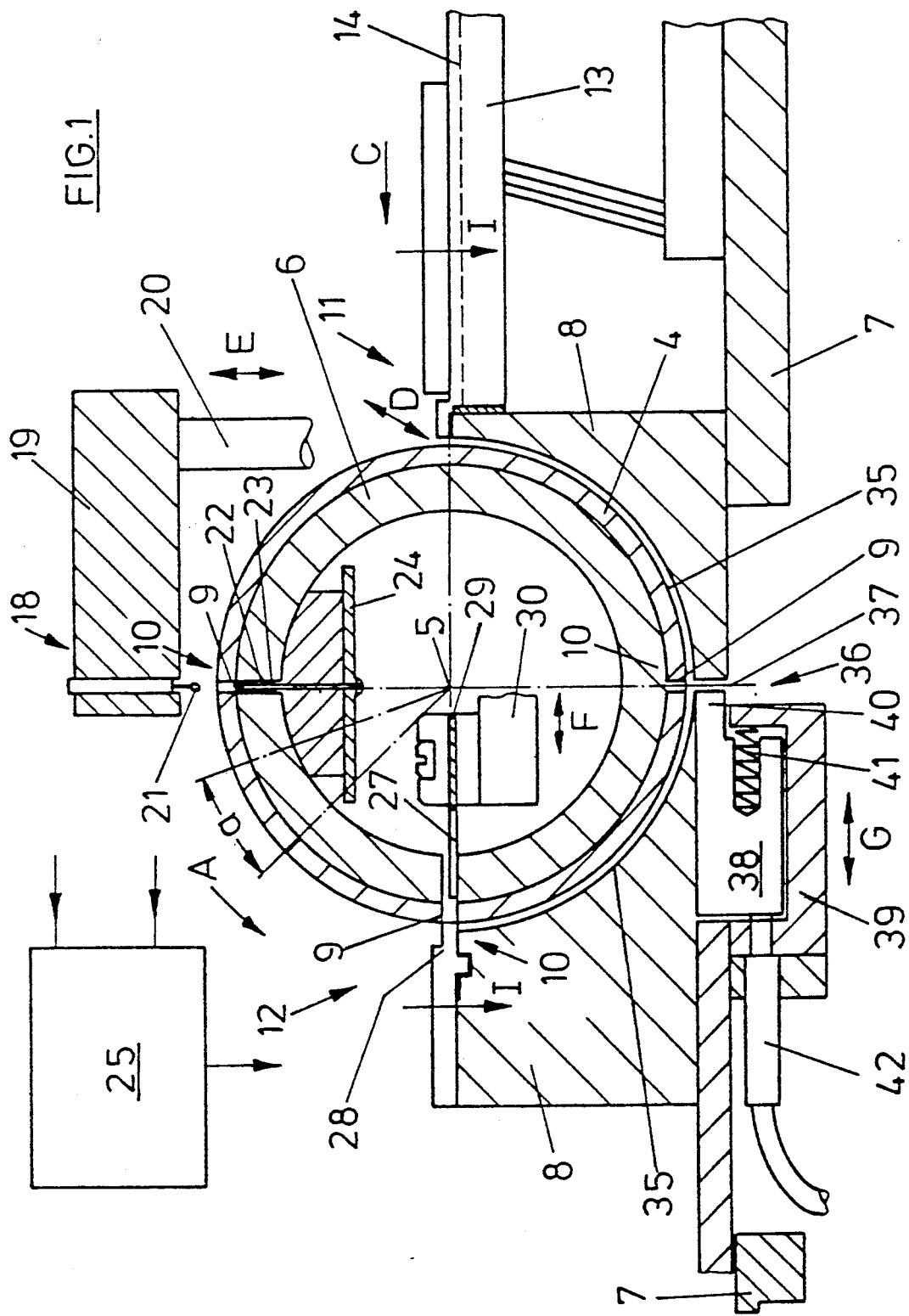

United States Patent
Sillner

[11] Patent Number: 5,131,206
[45] Date of Patent: Jul. 21, 1992

[54] METHOD AND DEVICE FOR THE INSERTION OF COMPONENTS, IN PARTICULAR ELECTRICAL COMPONENTS, PREFERABLY CHIPS, INTO DEPRESSIONS OF A TAPE

[76] Inventor: Georg Sillner, Buchenstrasse 23, 8411 Zeitlarn, Fed. Rep. of Germany

[21] Appl. No.: 615,984

[22] Filed: Nov. 20, 1990

[30] Foreign Application Priority Data

Nov. 29, 1989 [DE] Fed. Rep. of Germany ....... 3939404
May 12, 1990 [DE] Fed. Rep. of Germany ....... 4015315

[51] Int. Cl.⁵ .................. B65B 57/14; B65B 35/46
[52] U.S. Cl. .......................... 53/54; 53/493; 53/534; 209/573
[58] Field of Search .......... 53/54, 55, 53, 77, 493, 53/495, 534; 209/573, 574; 73/865.8; 324/158 F

[56] References Cited

U.S. PATENT DOCUMENTS

| | | | |
|---|---|---|---|
| 3,738,078 | 6/1973 | Schaaf | 53/54 |
| 4,094,439 | 6/1978 | List | 53/54 X |
| 4,905,445 | 3/1990 | Saitoh et al. | 53/54 |
| 5,005,338 | 4/1991 | Kemkers et al. | 53/54 X |

Primary Examiner—James F. Coan
Attorney, Agent, or Firm—Lucas & Just

[57] ABSTRACT

The invention relates to a novel method for the insertion of structural components, in particular electrical components and, in this connection, preferably chips, into depressions of a tape available on a component discharge, in which (method) the said components, in a predetermined orientation, are fed in multiple paths to a component intake and from there the first component of each path is in each instance received by a pickup slot on a transfer element rotating about a shaft and the components of each group so formed are tested and then inserted commonly into the available depressions at the component discharge when all components of the group have been found to be free of defects upon testing, and in which (method) defective components are removed from the pickup slots of the transfer element.

37 Claims, 9 Drawing Sheets

METHOD AND DEVICE FOR THE INSERTION OF COMPONENTS, IN PARTICULAR ELECTRICAL COMPONENTS, PREFERABLY CHIPS, INTO DEPRESSIONS OF A TAPE

The invention relates to a method according to the generic clause of claim 1 and to a device according to the generic clause of claim 10.

Today it is common practice to provide electrical components for further processing or use (assembly of switching circuits, etc.) in tape form. This likewise applies in particular to electrical components which are designed extremely small and are generally termed "chips" or "MELFs," such components especially likewise having no connecting wires but, rather, contact surfaces directly on the small plate-shaped and parallelepiped or rod-shaped component member. For mounting the components last mentioned, as well as other structural elements which have no or only very short leads, ribbons or tapes with small deep-drawn cuplike depressions, which are closed or sealed off by a band after insertion of the components, are commonly used.

It is likewise known that, to increase output in inserting chips in tapes, a device with a rotating transport element may be used, on which each of a plurality of pickup slots forms a group of such slots and a plurality of such groups is provided, so that, in one operation, a plurality of chips can in each instance be inserted simultaneously as a group in depressions available on the tape.

With the known device, it is disadvantageous that when a defective component at a pickup slot is identified or the absence of such a component is detected at a test station, all components of this group are discarded into a collection device for defective or faulty components. It is therefore necessary to sort the components found in said collection device into good and bad components in order to be able to return the good ones to the processing process, which, from the commercial viewpoint, is generally indispensable. In addition, the device required for this known method is relatively costly to construct.

The object of the invention is to disclose a method and/or device which eliminate/s the aforementioned disadvantages and by which the insertion of components in depressions of a tape is possible in essentially rational fashion and by a substantially simplified construction.

To accomplish this object, a method according to the characterizing portion of claim 1 and a device according to the characterizing portion of claim 8 have been designed.

Since in the method according to the invention only the defective component is in each instance removed from the respective group of components, while the other components of this group remain in their pickup slots on the transport element and are transported by this transport element to the component intake, it is ensured that only defective components actually reach the collection device for defective components, so that repeated sorting for defective and useful components is not necessary. The tape-insertion process as a whole is thereby substantially simplified.

The device according to the invention employs as transfer element a drum which, along the surface lines running parallel to the drum shaft, has the pickup slots forming the respective group. The use of a drum as transfer element not only permits the device to be executed in a particularly simple design, but likewise makes it possible to reject selectively, at a discard station, only those components in each group of components or pickup slots which have been found to be defective at a preceding test or inspection station.

The components to be processed by the invention are preferably chips, i.e., small plate-shaped or parallelepiped-shaped components. However, these components may alternatively be so-called MELFs or else other structural elements.

Further developments of the invention are the subject of the dependent claims.

Figure 2:
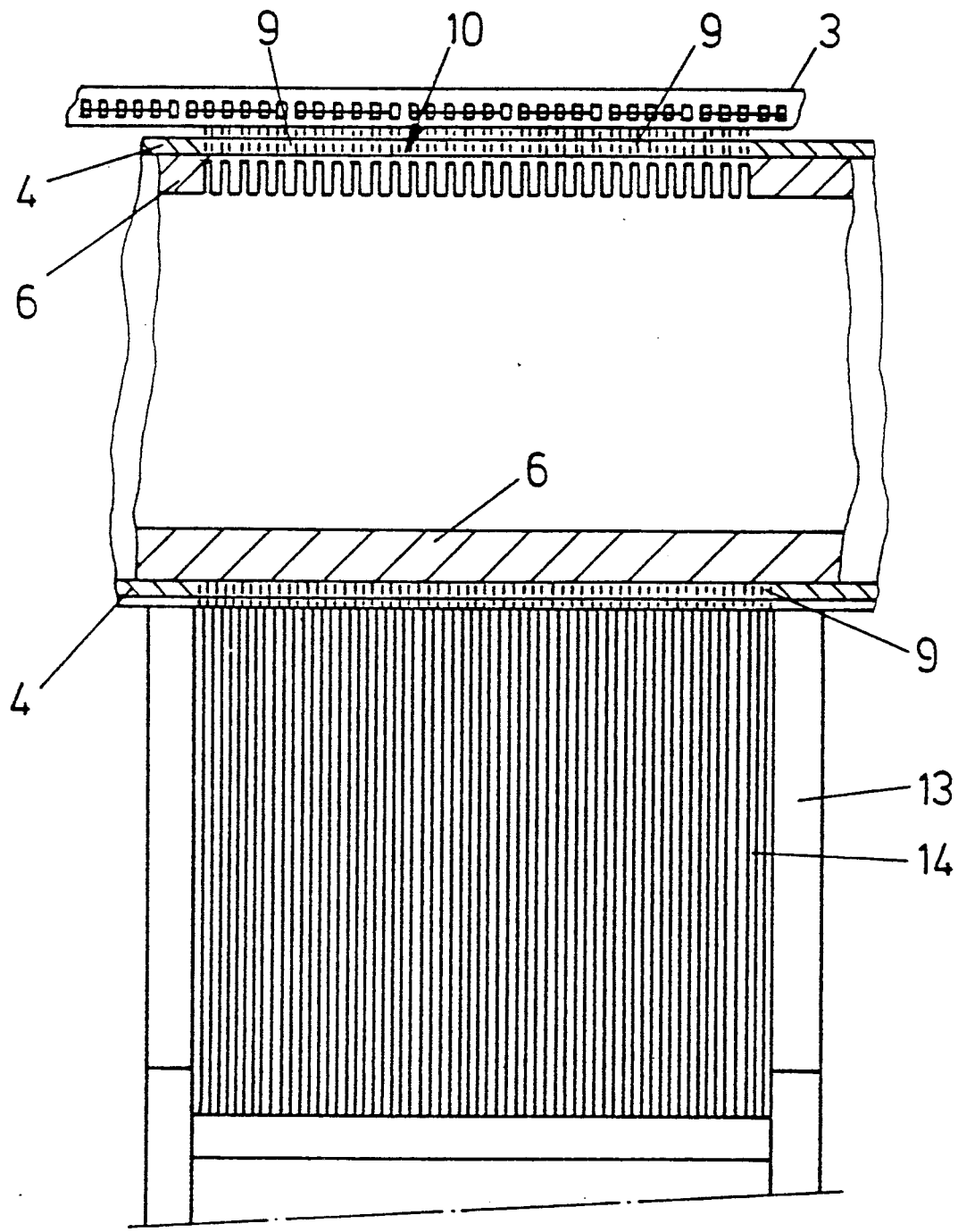
Figure 3:
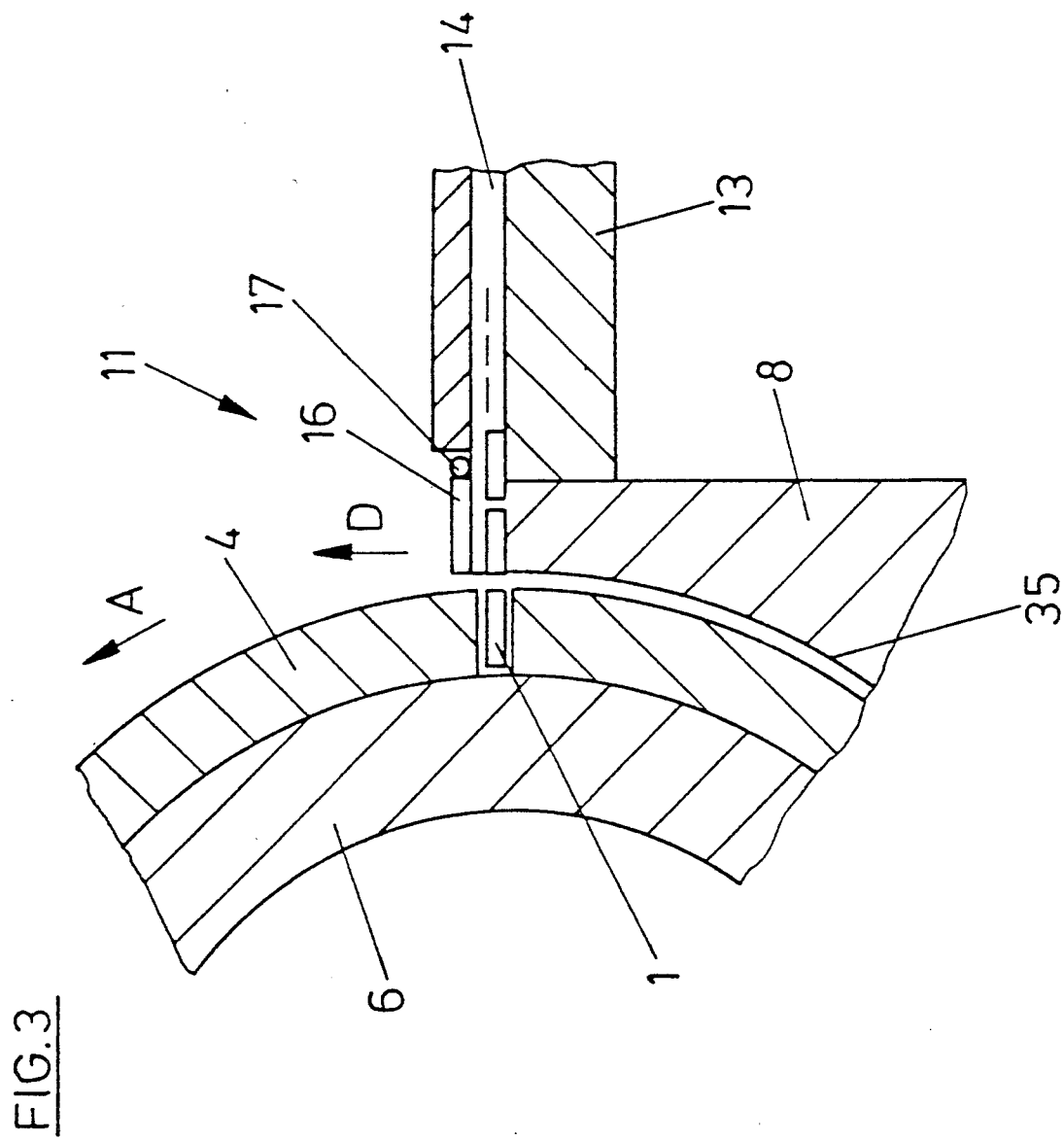
Figure 4:
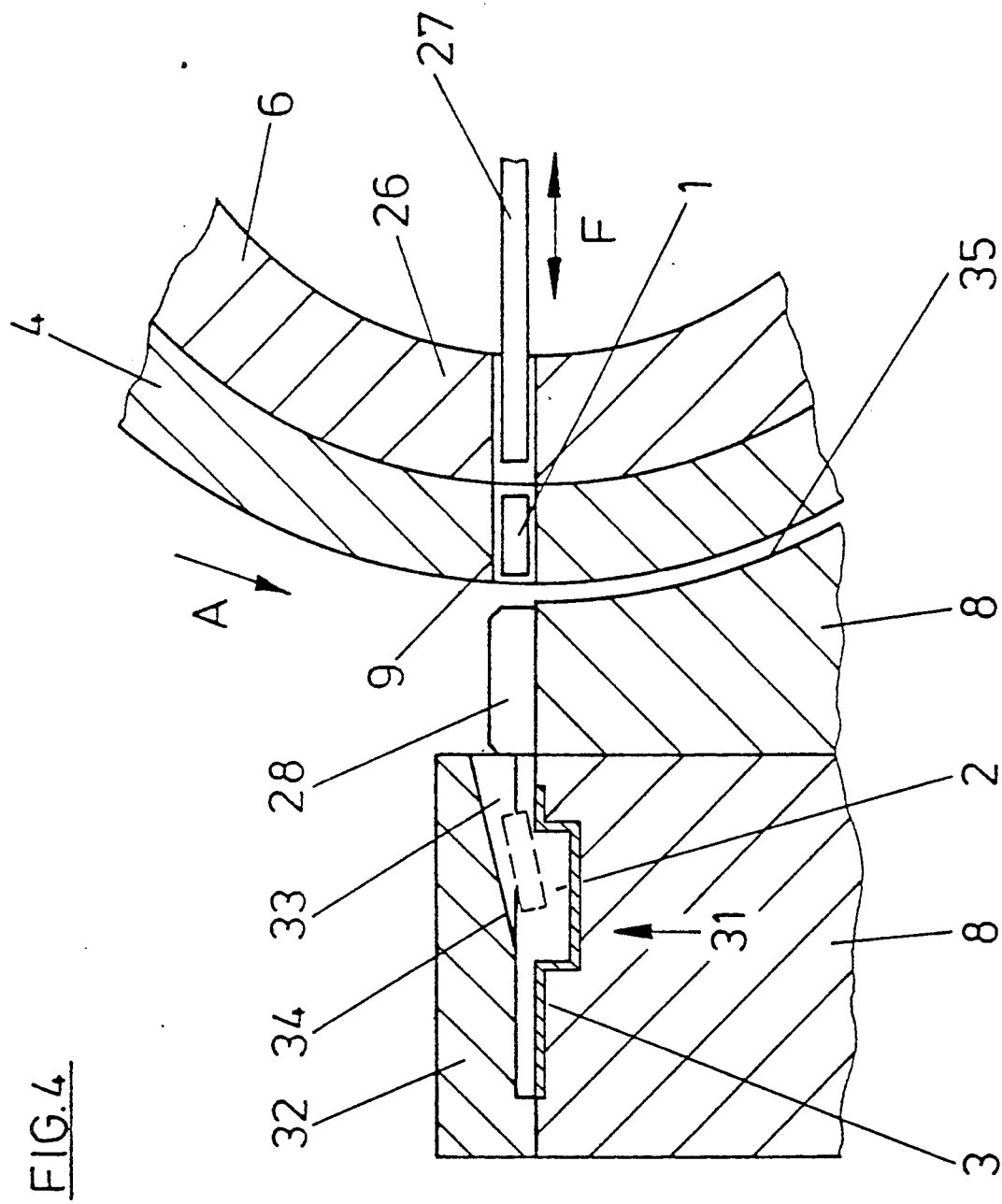
Figure 5:
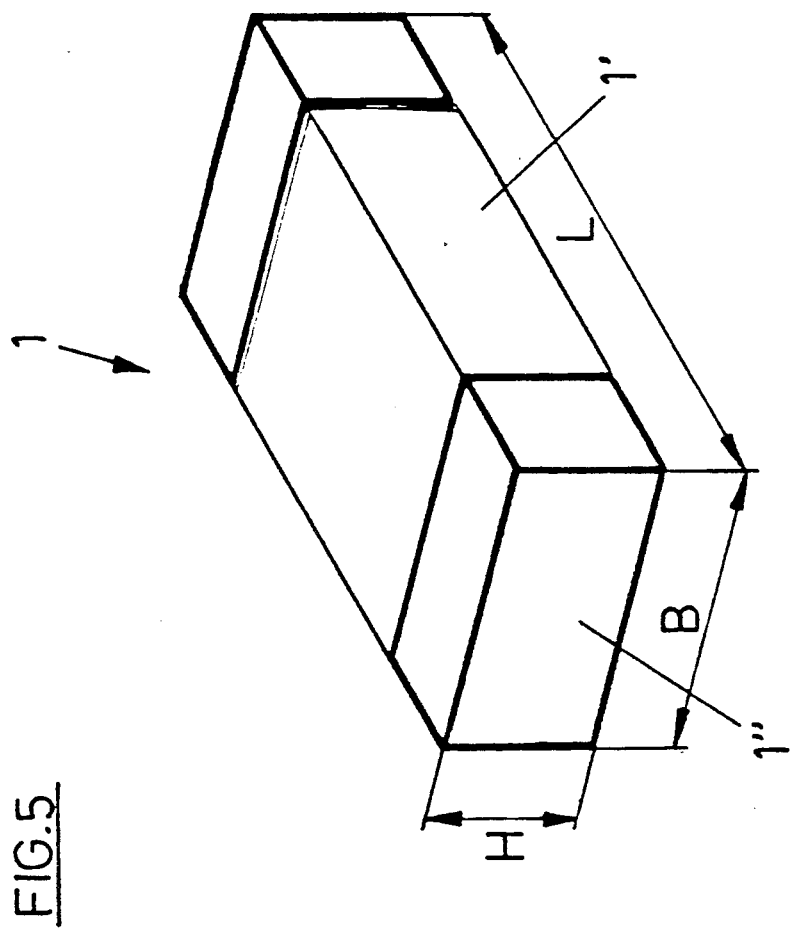
Figure 6:
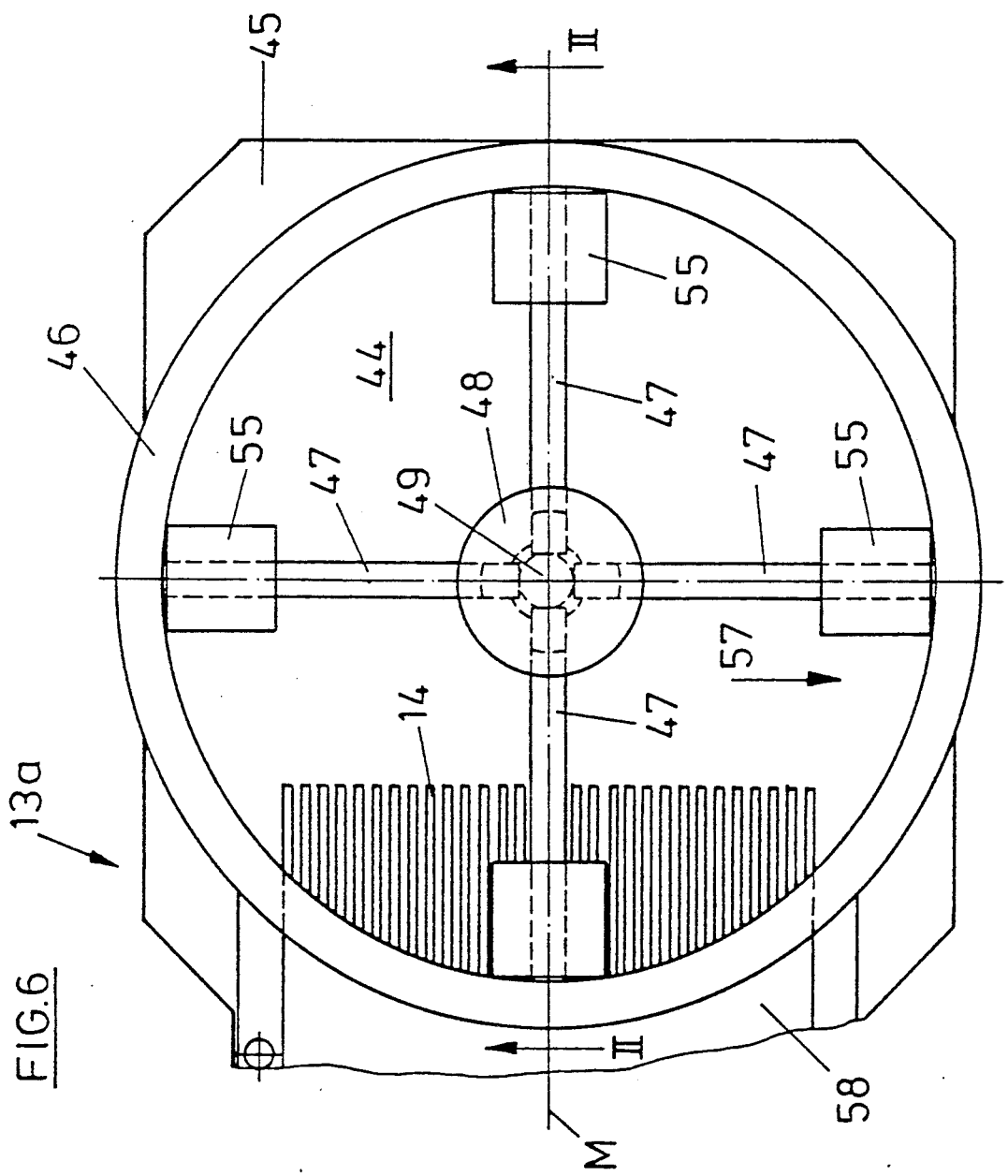
Figure 7:
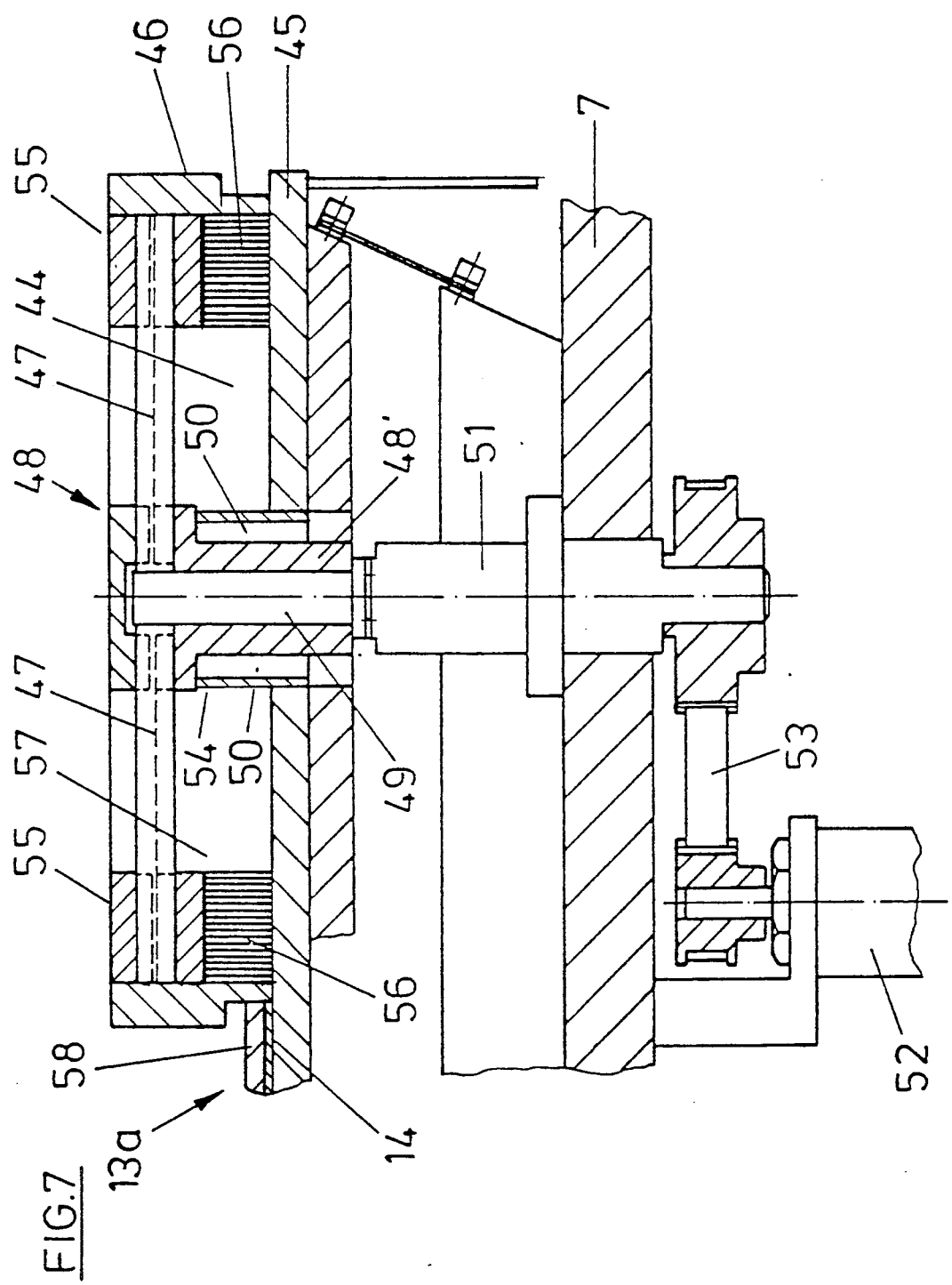
Figure 8:
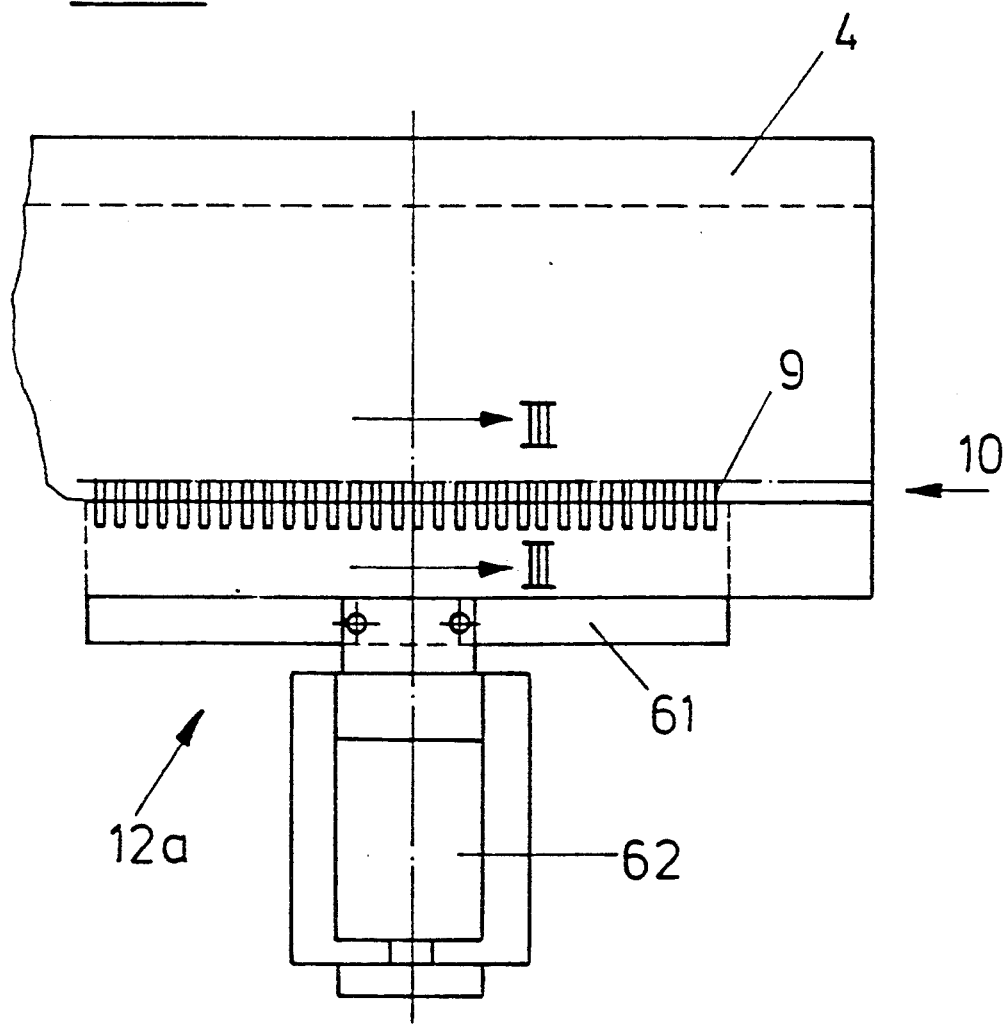
Figure 9:
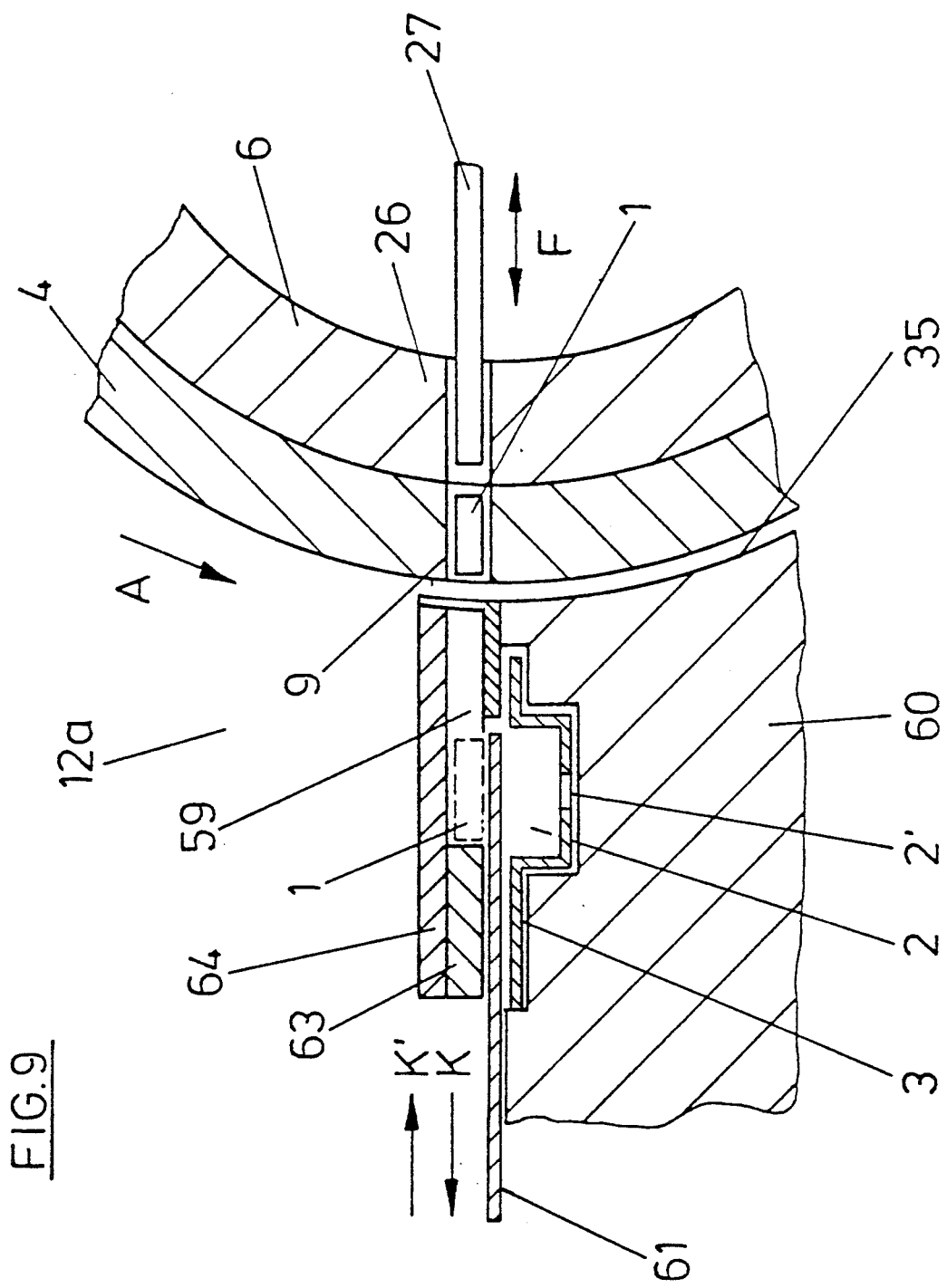

The invention is described below in detail by means of examples with the aid of the figures, wherein FIG. 1 shows, in schematic representation and in side view, as well as partially in section, a device for a high-performance chip-taping machine according to the invention;

FIG. 2, in simplified representation, a section along line I—I of FIG. 1;

FIG. 3, in simplified representation, a section through the drum of the chip-taping machine in the region of the chip intake;

FIG. 4, in a representation similar to that of FIG. 3, a section through the drum in the region of the chip discharge;

FIG. 5, in simplified representation, one of the components for which the device of FIG. 1 is designed;

FIG. 6, the end of a vibrating table, distant from the drum, in top view, in a modified embodiment of the invention;

FIG. 7, a section along line II—II of FIG. 6;

FIG. 8, in simplified representation and in top view, the component or chip discharge in an embodiment modified with respect to FIG. 1;

FIG. 9, in enlarged representation, a section along line III—III of FIG. 8.

The device shown in FIGS. 1 to 5 is used for the insertion of small plate-shaped electrical components 1 or chips into the cuplike depressions 2 of a tape 3, specifically, in such fashion that each of the successive depressions 2 in the longitudinal direction of the tape 3 in each instance contains only one component 1, specifically, in a predetermined orientation in the respective depression 2 adapted to the shape of the component 1. In the embodiment represented, the components 1, designed as small rectangular plates, are oriented in the depressions 2 with their long sides 1' perpendicular to the longitudinal direction or direction of travel of the tape 3.

For the simultaneous insertion in each instance of a plurality n of components 1 into the available depressions of the tape 3 in each cycle, the device has a drum 4, designed sleevelike or tubular, whose shaft 5 is oriented in horizontal direction, i.e., perpendicular to the plane of the drawing of FIG. 1, and whose inner surface is supported rotating about the outer surface of a bearing ring 6. The bearing ring 6 projects from the drum 4 at both ends and is fastened at these ends to the top of a supporting table 7 and/or to a supporting block 8 provided there. The drum 4 is driven, by a drive not shown in detail, in steps about its shaft 5 in the direction of the arrow A, i.e., counterclockwise in the representation selected for FIG. 1, while the motional step corresponds to one graduation, i.e., the angle a, in each cycle.

The drum 4 is provided with a plurality of apertures 9, each of which has a rectangular cross section, adapted to the quadratic cross section of the small plate-shaped or parallelepiped-shaped components, which is slightly greater than the cross section of the narrow sides 1". The apertures 9, each of which is designed continuous, i.e., extends from the outside of the drum 4 to the inner surface of said drum, are in each instance arranged in groups, each of these groups having a number of n apertures 9, for example thirty apertures 9, and the apertures 9 of each group 10 are arranged at uniform distances apart, in each instance along a surface line running parallel to the drum shaft 5. At the periphery of the drum 4, i.e., in the direction of rotation A, the individual groups 10 are spaced apart at distances which correspond to the graduation or angle a. All the apertures 9 of all groups 10 in each instance have the same rectangular cross-section, whose larger cross-sectional side is oriented in the direction of the respective surface line and is equal to or slightly greater than the width B of the component 1 at its two ends or narrow sides 1". In the direction perpendicular to the respective surface line, the cross-sectional dimension of each aperture 9 is equal to or slightly greater than the height H of the component 1 at its two ends or narrow sides 1". The thickness of the drum 4 (distance apart of inner and outer surfaces of this drum) is equal to or somewhat greater than the length L of the component 1.

With the graduation as reproduced in FIG. 1, a total of sixteen groups 10 are provided on the drum 4. In principle, a smaller or preferably still greater plurality of groups is alternatively possible, the number of groups upward being limited only by the fact that, for reasons of stability, a sufficiently great distance, for example a distance of 4 mm, is still necessary between two successive groups 10 on the periphery of the drum 4. The higher the number of groups 10, the higher the outputs (components 1 processed per unit of time) obtainable with small accelerations.

For operation it is advantageous to select an even number of groups 10, so that the component intake 11 and the component discharge 12, in the region of a common horizontal plane enclosing the shaft 5, can be provided displaced 180° about the shaft 5, i.e., on either side of the drum 4.

In the representation selected for FIG. 1, the components 1 are fed to the drum 4 from the right, i.e., in the direction of the arrow C, specifically, on a multiple feed in the form of a vibrating table 13, which on its upper side is provided with a plurality of grooves 14 open upward, which in each instance extend in the direction of feed C and are provided side by side transverse to this direction of feed. Each groove 14 has a width which is slightly greater than the width B of the components 1 and a depth which is equal to or slightly greater than the height H of the components 1. In addition, each groove 14 has an open end at the component intake 11. Further, the vibrating table 13, with its grooves 14, is arranged in the region of a horizontal plane likewise enclosing the shaft 5 in such fashion that in each stationary phase of the cyclic rotary motion of the drum 4 a groove 14 in the region of the component intake 11 continues in an aperture 9 of the drum 4.

At the right end of the vibrating table 13, not illustrated in FIG. 1, the components 1, in an unarranged quantity, for example, in a storage container, not represented, are placed on the table 13. The vibration of this table then causes at least most of the components 1 in each instance to reach a groove 14, specifically, in such fashion that, at least in the region of the component intake 11, a series of components 1 is available in each groove 14, in which (series) the narrow sides 1" of the components are immediately adjacent to one another and their length L is oriented in the longitudinal direction of the respective groove 14 and their height H is oriented perpendicular to the floor of the respective groove 14, i.e., in vertical direction. By means not illustrated in detail but nevertheless well known to those skilled in the art, for example, by a roll with elastic scrapers projecting over the periphery of this roll, arranged above the upper surface of the vibrating table 13 and driven rotating about a shaft parallel to the shaft 5, it is provided that in the region of the component intake 11 all components 1 in the grooves 14, whose number is again equal to n, have the aforementioned orientation. A cover plate 15 covers the grooves 14 at the component intake 11, so that there the grooves 14 likewise form closed channels toward the top. However, the plate 15 does not reach as far as the drum 4, but ends at some distance from this drum. Between the plate 15 and the drum 4 there is provided a valve 16 which, like the plate 15, extends at least over the whole width occupied by the grooves 14 (parallel to the plane of the drawing of FIG. 1) of the vibrating table 13 and in the region of its edge adjoining the plate 15 is capable of swiveling upward about a horizontal swivel shaft 16 running parallel to the shaft 5 in the position represented in FIG. 3, against the effect of a restoring means, for example, restoring spring, in the direction of the arrow D. In the stationary phase of the rotary motion of the drum 4 each groove 14 lies with its floor at the same level as the lower horizontal limiting surface of an aperture 9.

Following the component intake 11 in the direction of rotation A of the drum 4, there is provided a test or inspection station 18, specifically, at a distance which corresponds to a multiple of the graduation, i.e., in the embodiment illustrated, to four times the graduation or angle a. The test station 18, by which the function of the component 1 is tested and which in each instance is located in the uppermost region of the drum 4, consists of a bar 19, the longitudinal extension of which lies parallel to the shaft 5. At one side the bar 19 is fastened, at either end in each instance, to a vertical rod 20 which, for its part, is displaceable up and down in vertical direction (double arrow E) in guides of the supporting block 8, specifically, synchronously with the drive of the drum 4. At its other long side turned away from the rod 20, the bar 19 has a plurality of contact pins 21 projecting beyond the underside of this bar, whose number is again equal to the number of apertures 9 of each group 10 and which are provided successively in an axial direction parallel to the shaft 5 at uniform distances apart such that in each stationary phase of the drum 4 each contact 21, arranged radially to the shaft 5, is provided in the region of an aperture 9. In addition, at the test station continuous apertures 22 are provided congruent with each contact pin 21 in the bearing ring 8 and in each aperture a contact pin 23 is arranged in such fashion that its end lying radially outward lies at approximately the same level as the adjoining outer surface of the bearing ring 6. The other end of the contact pins 23 extends into the interior enclosed by the bearing ring 6 and is there in each instance connected with strip conductors of a printed circuit 24, which produces a connection of the contact pins 23 to a testing and control means 25. The contact pins 21 are likewise connected with this testing and control means 25. In addition, the bar 19 is controlled so that in each stationary phase of the drum 4 the bar 19 is lowered onto the drum 4 and a component 1 arranged in an aperture 9 is gripped between each pair of contact pins 21/23, i.e., its contact surfaces formed at the fronts 1" rest against the contact pins 21 and 23 of the contact pin pair concerned. In each stationary phase of the drum 4 all components 1 reaching the test station 18 are therefore checked by the testing and control means 25 with respect to their electrical data, function, etc.

It is understood that the drum 4, at least in the region of the apertures 9, as well as the bearing ring 6, at least in the region of the test station 18 and where the exposed contact surfaces of the contact pins 23 are formed, consist of electrically insulating material, to permit electrical testing of the components 1.

The component discharge 12 is provided following the test station 18 in the direction of rotation A, specifically, again at a distance corresponding to a quadruple graduation. Here the bearing ring 18 has a plurality of continuous apertures 26, whose number is equal to the number of apertures 9 of each group 10, i.e., is equal to n. The apertures 26 are provided so that in each stationary phase of the drum 4 each aperture 26 is arranged congruent with an aperture 9 located at the component discharge.

To each aperture 26 is assigned a ram 27 whose longitudinal axis extends in horizontal direction radially to the shaft 5 and which is movable in its axial direction, i.e., in the direction of the double arrow F, between a rest position in which the end of each ram 27 lying radially outside in reference to the shaft 5 is located within the outer peripheral line of the bearing ring 6, i.e., within the aperture 26, and a working position in which the free end of each ram 27 projects through an aperture 9 of the drum 4 so far beyond its outer surface that the component 1 found in the aperture 9 is not only pushed out of this aperture by the respective ram 27, but is likewise slipped, via a guide provided at the component discharge 12 adjoining the drum 4, from the side into an available depression 2 of the tape 3, as indicated in FIG. 4 by the component 1 represented by broken lines. These guides are short grooves 28, open toward the top as well as at both ends, of which a groove 28 is in each instance arranged with its longitudinal extension equiaxial with the longitudinal extension of a ram 27, i.e., radially to the shaft 5.

At their end near the shaft 5 all rams 27 are joined together via a common crosspiece 29 into a comblike structure and fastened by this crosspiece 29 to a slide 30, which is arranged in the inner space enclosed by the bearing ring 6 and is displaceable to and fro in the direction of the double arrow F, specifically, by a corresponding drive synchronous with the motion of the drum 4, but likewise controlled by the testing and control means 25, as will be described in greater detail below.

Each groove 28, of which the left end in FIGS. 1 and 4 lies adjacent to an aperture 9 in each stationary phase of the drum 4, ends with its other open end at a long side of the tape 3, specifically, at that long side to which, owing to the unsymmetrical design of the tape 3, the cups or depressions 2 are closest. The grooves 28 are formed at the upper side of the supporting block 8, specifically, just like a guide 31 for the tape 3, which with depressions 2 open upward, is moved forward in this guide running horizontal and parallel to the shaft 5 by a drive, not represented in detail, synchronous with the rotary motion of the drum 4 by a tape length corresponding to the number n of depressions 2 whenever, owing to motion of the ram 27 or of the slide 30 out of the rest position into the working position, a number n of components 1 have been pushed by these rams out of the drum 4 into the depressions 2 available at the component discharge 12. To facilitate this insertion of the components 1 by means of the ram 27 and, in particular, likewise to ensure that the components 1 are arranged in orderly fashion after insertion into the respective depression 2, a guide plate 32, preferably removable, is attached to the supporting block 8 in the region of the component discharge 12, above the guide 31. At its underside the guide plate 32 is shaped so that it permits a movement of the tape 3 in the direction of feed, i.e., it forms a receiving slot for the tape 3 between itself and the facing surface of the guide 31 in each instance. In the region of the side turned toward the drum 4, i.e., where the guide plate 32 meets the ends of the grooves 28 turned away from the drum 4, the guide plate 32 is provided at its underside with guide grooves 33 open toward this underside, the number of which is equal to the number of grooves 28 or to n and each of which connects to a groove 28. Each guide groove 33 has an upper limiting surface 34 designed as an inclined plane, which is sloped such that at the region of transition between a groove 28 and a guide groove 33 each surface 34 is located above the horizontal plane of the bottom surface of the grooves 28 and approaches this plane with increasing horizontal distance from the respective groove 28. The guide grooves 33 are in each instance located above a depression 2 available at the component discharge 12. Upon being pushed out of the drum 4, the components 1 are safely conducted into the respective depression 2 by the guide grooves 33. It is understood that the common distance between two adjacent grooves 14 (at least at the component intake 11), the common distance between two apertures 9 of each group 10, and the common distance apart of two adjacent grooves 28 and guide grooves 33 is equal to the distance of two adjacent depressions 2 on the tape 3.

Following the component discharge in the direction of rotation A of the drum 4, the supporting block 8 forms a guide surface 35 circular in shape and surrounding the drum 4 at its peripheral surface, which in the direction of rotation A extends as far as the component intake 11. This guide surface 35 is designed so that components 1 which have not been pushed out of the drum 4 at the component discharge 12 by means of the ram 27 remain in the apertures 9 of this drum and are moved forward with the drum 4, specifically, as far as the component intake 11, provided the components 1 have not first been rejected at a discard station 36.

The discard station 36 follows the component discharge 12 in the direction of rotation A, specifically, at a distance which again corresponds to four times the graduation or four times the angle a. The discard station 36 is thus located at the lower region of the drum 4 in each instance. At the discard station 36 the guide surface 35 is interrupted by a slotlike aperture 37, which extends in horizontal direction parallel to the shaft 5 and which is arranged so that in each stationary phase of the drum 4 all apertures 9 of a group 10 are located above the slotlike aperture 37 and the components 1 in all apertures 9 of this group can fall out through the slot 37 down into a collection receptacle for defective components 1, not illustrated. Instead of the slotlike aperture 37, individual apertures may alternatively be provided, each of which then has a cross-section which is at least somewhat greater than the cross section of the apertures 9 and each of which, in the stationary phase of the drum 4, lies congruent with an aperture 9 of the group 10 located at the discard station 36.

At the discard station 36 there is additionally provided a slide arrangement which consists of a plurality of slides 38, the number of these slides again being equal to the number n of the apertures 9 of each group 10. Each slide 38 is made of flat stock and is arranged upright, i.e., with its surface sides in vertical planes perpendicular to an axial direction running parallel to the shaft 5, in a slot or guide 39, specifically, packagelike, i.e., with its larger surface sides in each instance lying directly side by side. The guide 39 with the slides 38 is attached to the underside of the supporting block 8 in suitable fashion. The slides 38 are in each instance displaceable in the guide 39 in a horizontal axial direction running perpendicular to the shaft 5, i.e., in a horizontal axis running parallel to the surface sides of the slide 38 corresponding to the double arrow G, specifically, between a working position, in which a shoulder 40 on each slide bar closes off a portion of the slotlike aperture 37 corresponding to the width of this shoulder 40, and a rest or starting position, in which each shoulder 40 exposes this portion of the slotlike opening 37 assigned to it. The slides 38 are in each instance pretensioned by a compression spring 41 in their position exposing the aperture 37. In addition, the slides 38 are arranged so that each slide 38 or its shoulder 40 is located in the region of an aperture 9 of each group 10 which upon rotation of the drum 4 passes the discard station 36. To each slide 38 there is assigned a special actuating component, i.e., in the embodiment illustrated, a special pneumatic cylinder 42, which is activated via the testing and control means 25 and upon actuation of the associated slide moves into its position shutting off the associated portion of the aperture 37.

Operation of the device or the chip-taping machine may be described as follows:

It is assumed that a tape 3 has been duly inserted in the guide 35, so that the tape 3 is available with a length at the component discharge 12.

Components 1 are put on the vibrating table 13. When the drive, not illustrated in detail, for the vibration table 13 is switched on, these components reach the grooves 14 there, so that rows of components 1, which have the correct orientation, are in each instance formed in these grooves, at least in the region of the component intake 11. The first component of each row or groove 14, because of the delivery effect exerted by the vibrating table 13 or because of the pushing effect of the components 1 behind it, reaches an aperture 9 of the group available at the component intake 11. The drive, not illustrated in detail, likewise causes the drum 4 to be moved forward cyclically, so that in the next stationary phase of the rotary motion of the drum 4 the apertures 9 of a new group 10 can be filled with components 1. After four cycle steps, each group 10 reaches the test station 18. There all components 1 of this group are tested during the stationary phase of the drum 4.

Each group 10 and within each group 10 each aperture 9 is likewise assigned a special identification, for example, a digit, so that on the basis of this identification that group 10 and within this group that aperture 9 may be stored in a memory of the testing and control means 25, wherein a defective component 1 or, in fact, the absence of such a component has been identified upon inspection or testing by the test station 18.

Whenever a group 10 reaches the component discharge 12 and no defect (defective component 1 or absence of one or more components 1) has been identified in testing of this group at the test station 18, the slide 30 is moved out of its rest position into the working position, whereupon all components 1 of the respective group 10 in the apertures 9 are inserted into the available depressions 2 of the tape 3.

Whenever the slide 30 is actuated, the tape 3 is likewise moved forward by a drive, not illustrated in detail, by a length which is equal to the number n of depressions 2. It is understood that the tape 3 is here drawn off from a supply in the form of a coil and the depressions 2 furnished with the components 1 are sealed by a band at a station, not illustrated in detail, following the component discharge 12 in the direction of travel of the tape 3.

Whenever a defect in a group 20 has been identified on testing or inspection by the test station 18, no discharge of components 1 of this defective group, i.e., no actuation of the slide 30, takes place at the component discharge. Rather, the components 1 of this group remain in the respective apertures 9 of the drum 4 and are moved past the component discharge 12 to the discard station 36. After the group 10 preceding the defective group has passed the discard station 36, the testing and control means 25, based on the data stored there, actuate the pneumatic cylinders 42 of those slides 38 for closing the aperture 37, which (slides) are assigned to apertures 9 of the defective group 10 in which good, i.e., non-defective, components 1 are present. The aperture 37 thus remains open only where defective components 1 are present in apertures 9 of the defective group, which defective components then move through the aperture 37 by gravity and, optionally supported by air blast, reach a receptacle for the defective components. The good components 1 of the defective group are returned with the drum 4 to the component intake 11, at which only the vacant apertures 9 are then filled with the components 1 available in the grooves 14.

It is understood that the tape 3 is not moved forward when a defective group has passed the component discharge 12.

The valve 16 makes it possible to insert components 1 which, after leaving the component intake, have not yet gotten completely into the respective aperture 9 of the drum 4, into this aperture. A sensor cooperating with the valve 16 is advantageously provided, which sensor halts the chip-taping machine when a component 1 has become jammed in an aperture 9 and the valve 16 is thus swung aside.

The device described above has the advantage, inter alia, that the components 1 are mounted on the tape, i.e., inserted into the depressions 2 of the tape 3, at high levels of performance and with great reliability. In addition, the device described in particular also has the advantage that at the discard station 36 only bad or defective components 1 are removed in each instance, in other words, only defective components are found in the receptacle there. Thus it is likewise unnecessary to sort the components rejected at the discard station into good and bad components again. Owing to the possibility of a small graduation (small angle a), small forces of acceleration with a high output are possible, which contributes substantially to gentle treatment of the components 1, as well as to low wear of the drive. The lateral insertion of the components 1 at the discharge station 12 likewise ensures that the components 1 are safely positioned in the respective depression 2 in orderly fashion.

To be able to identify the groups 10, there is provided on the drum 4 a signal transmitter revolving with this drum which, for example, emits a signal to the testing and control means 25 corresponding to the identification or identification number of that group 10 which, for example, has just reached the test and inspection station 18. Identification of the individual apertures 9 of the respective group 10 is effected by the arrangement of the contact pins 21 and 23.

Varying from the mode of operation described above, it is alternatively possible to provide an additional station following the discard station 36 in the direction of rotation (A) of the drum 4, at which station all good components 1 not rejected at the discard station 36 are then discarded. Although this embodiment would then have the disadvantage that, at the component intake 11, a component 1 would in each instance have to be inserted in all apertures 9 of each group 10, this procedure is possible, in particular with unpolarized components 1, i.e., for example with passive components 1 (e.g., capacitors), where the components 1 removed from the drum 4 at the additional station provided between the discard station 36 and the component intake 11 are returned to the vibrating table 13. This likewise effectively prevents bad and good components 1 ejected from the drum 4 from being recombined.

FIGS. 6 and 7 show the vibrating table 13a of another embodiment of the device according to the invention, which differs from the device of FIG. 1 essentially only by the design of this vibrating table.

The vibrating table 13a again has on its upper side the grooves 14, which extend as far as the component intake 11 and the ends of which lying distant from this component intake 11 end at a region 44 which is formed essentially at the flat or plane upper side of the plate 45, forming the vibrating table 13a, within a ring 46. The region 44 is surrounded or limited laterally by the ring 46, whose axis lies essentially perpendicular to the upper side of the plate 45 and likewise intersects the center line M of the vibrating table 13a extending in the direction of the grooves 14.

By means of four arms 47, running radially to the axis of the ring 46, the ring 46 is connected by a hublike component 48 to a spoked wheel which at the upper end is attached to a shaft 49. With a segment 48' accommodating a partial length of the shaft 49, the component 48 extends through an aperture 50 of the plate 45, the aperture 50 having a diameter which is greater than the segment 48'. Underneath the plate 45 the shaft 49, by means of a bearing 51, is supported rotary on the supporting table 7 about the axis of the ring 46 running essentially perpendicular to the surface sides of the plate 45, specifically, such that the lower face of the ring 46 is at a distance from the upper side of the plate 45 which in any case is essentially shorter than the smallest dimension of the components 1, i.e., than the height H of these components. The shaft 49 and with it the ring 46 are driven rotating about the ring axis RA by means of a drive provided on the supporting table 7, specifically, by means of a drive motor 52 and a toothed belt 53. In the embodiment illustrated, this drive is designed so that the ring 46 is in each instance alternately turned about the ring axis RA in one direction and in the other direction, specifically, for example, about a full rotation or about another suitable angular amount in each direction.

A ring 54 surrounding the segment 48' at a distance is inserted in the aperture 50, which ring projects beyond the upper side of the plate 45 and thus forms an edge closing off the region 44 from the aperture 50.

As FIG. 7 shows, the arms 47 are arranged at some distance above the upper side of the plate 45. To each arm 47 is attached a block 55 radially outside in the immediate vicinity of the inner side of the ring 46, which block is provided on its underside with a plurality of bristles 56 projecting downward, so that each block 55, together with the bristles 56, forms a brush which rests against the upper side of the plate 45 by these bristles, specifically, with a corresponding rotary position of the ring 46 in the region of the grooves 14 as well. The length of the bristles 56 is selected so that the lower ends of the latter extend as far as the plane of the upper surface of the plate 45. Outside the wheel of brushes formed by the ring 46 and the brushes 57, the upper side of the plate 45 is covered in the region of the grooves 14 by a plate 58, so that the grooves 14 likewise form closed channels upward for the components.

In this embodiment the components 1 to be processed are placed or fed into the region 44. Owing to the to-and-fro rotary motion of the wheel of brushes or ring 46, likewise supported by the vibrating motion of the plate 45 relative to this wheel of brushes, the components 1 are placed by the bristles 56 of the brushes 57 in the required position or orientation in the grooves 14, while incorrectly oriented components 1, for example, those standing on the floor of a groove 14 by their long side and accordingly projecting beyond the upper side of the plate 45, are removed from the corresponding groove by the brushes 47. Only correctly oriented components 1 are able to pass the underside of the ring 46 and reach the partial segment of the respective groove 14 in each instance covered by the plate 58. The rotary motion of the wheel of brushes or ring 46, in conjunction with the vibration of the plate 45, results in a sufficient number of components 1 being found in each groove 14 at all times and hence satisfactory operation of the device is ensured.

FIGS. 8 and 9 show another embodiment of the device according to the invention, which differs from the embodiment of FIGS. 1-4 essentially in that instead of the component discharge 12 a component discharge 12a is provided, wherein the components 1 of each group 10 of apertures 9 are in each instance inserted into the end of a channel 59 by means of the ram 27. After insertion all components 1 are then in each instance dropped, in vertical direction, into a depression 2 of the tape 3 located under each channel 59.

Each channel 59 is formed on the upper side of a supporting block 60, which is attached in the same way as the block 8 to the upper side of the supporting table 7, not illustrated in FIGS. 8 and 9. The longitudinal extension of each channel 59 lies radial to the shaft of the drum 4, specifically, equiaxial with in each instance a ram 27, so that in the corresponding rotary positions of the drum 4 the right end of each channel 59 in FIG. 9 opens into an aperture 9 of the drum 4. Otherwise each channel 59 is closed off at its left end in FIG. 9, at its two long sides and at the top, but on the underside as well. At the left end in FIG. 9 the underside of all channels 59 is formed of a thin plate 61 of a suitable material, for example of steel, which is arranged with its surface sides in a horizontal plane running essentially radially to the axis M and in this plane is movable, radially to the shaft 5 out of the position illustrated in FIG. 9 according to the arrow K, radially outward into an opening position, in which the plate 61 on the underside of all channels 59 exposes an aperture under which a depression 2 of the tape 3 is then available in each instance. In this opened position the plate 61 can be moved, in the direction of the arrow K', back into the closed position. For this movement the plate 61 is attached to a slide 62 borne on the supporting table 7 in suitable fashion and moved to and fro, synchronously with the drive of the drum 4, radially to the drum shaft 5.

As FIG. 9 shows, the upper side of the diaphragm or plate 61 is at the same level as the underside of each channel 59 outside the plate 61, so that upon discharge from the drum 4 each component 1 is able to reach the closed end of the associated channel 59 without hindrance. The plate 61 is then opened, so that the components 1 fall down into a depression 2 available in each instance. The component discharge 12a, compared with the component discharge 12, has the advantage that discharge of the components 1 from the drum 4, as well as insertion of these components 1 in the depressions 2 of the tape 3, or the movements necessary for this, are separated. A substantially improved insertion of the components 1 into the depressions 2 is thereby ensured. In particular, any tipping or tilting of the components 1 upon insertion into the depressions 2 is likewise prevented, specifically, even when the tape 3 has an aperture 2' in the region of the depressions 2 in each instance, as is often the case.

To obtain as simple as possible a design, the channels 59 are executed in that to the upper side of the supporting block 60 is attached a comblike element 63, which in each instance has at a continuous segment 63' a plurality of pronglike segments 63'' projecting from a common side of this segment, each two of which form a channel 59 between them. To the upper side of the element 63 is attached a plate 64, which shuts off the channels 59 toward the top. It is understood that all channels 59 are designed so that the components 1 in these channels are in each instance only seated with the correct orientation.

The invention has been described above by way of examples. It is understood that modifications and variations are possible without thereby departing from the basic idea of the invention. Thus, it is alternatively possible, for example, to provide, instead of the channels 59, corresponding channels which can not be opened on their underside, but are open at their upper side. Elements inserted into these channels are then removed from the channels by a multiple suction basket and inserted into the depressions 2 of the tape 3, which in this case is provided laterally from the closed end of the channels.

I claim:

1. A method for the insertion of structural components into available depressions of a tape at a component discharge, said method comprising:
    (a) feeding the components, in a predetermined orientation, on multiple paths to a component intake;
    (b) receiving the first component of each path by a pickup slot on a transport element rotating about a shaft;
    (c) testing the components of each group;
    (d) removing defective components from the pickup slots of the transport element at a discard station following in the direction of rotation of the transfer element;
    (e) transporting the remaining non-defective components by the transfer element to a subsequent station; and
    (f) inserting the non-defective components into the said available depressions of the tape.

2. The method of claim 1 wherein the components are fed from the said subsequent station to the component intake.

3. The method of claim 1 wherein the non-defective components remaining in the transfer element are transported to the component intake where voids caused by removed defective components are filled with new components.

4. The method of claim 1 wherein the transport element comprises a drum which rotates about a shaft, said shaft being transverse to the axial direction in which the components at the component intake are inserted into the pickup slots of the drum.

5. The method of claim 4 wherein the drum is rotated about an essentially horizontal shaft and insertion of the components at the component intake is effected in a horizontal direction.

6. The method of claim 4 wherein the drum is rotated about an essentially horizontal shaft and extraction of the components at the component discharge is effected in a horizontal direction.

7. The method of claim 4 wherein insertion of the components is effected radially to the drum axis.

8. The method of claim 4 wherein extraction of the components is effected radially to the drum axis.

9. The method of claim 1 wherein the feed of the components is effected by a vibrating conveyor which has a plurality of grooves forming feed paths.

10. The method of claim 1 wherein the components are extracted from the pickup slots of the transport element by ejection by a plurality of rams.

11. The method of claim 1 wherein the components are inserted into the depressions by slipping them in from the long side of the tape.

12. The method of claim 1 wherein the structural components are selected from the group consisting of electrical components, microchips and MELF's.

13. A device for the insertion of structural components into available depressions of a tape at a component discharge, said device having:
    (a) means for multiple-path feed of the components in a predetermined orientation to a component intake of the device;
    (b) a transport element capable of rotating about a shaft;
    (c) said transport element being a drum having a shaft which forms the axis of the machine;
    (d) said transport element having a plurality of groups of pickup slots for the components;
    (e) the groups of pickup slots at the outer surface of the drum being formed along a surface line which runs parallel to the drum shaft;
    (f) said transport element being capable of transporting a group of components from the component intake to the component discharge; and
    (g) means for insertion of the components of each group of pickup slots at the component discharge into depressions in a tape.

14. The device of claim 13 wherein the drum is of circular cylinder shape at the peripheral surface having the pickup slots.

15. The device of claim 13 wherein the pickup slots are apertures in the drum.

16. The device of claim 13 wherein the drum at its part having the pickup slots is sleeve-like with a circular cylinder-shaped inner surface, and wherein the inner surface rotary is supported on a circular cylinder-shaped outer surface of a fixed core or support.

17. The device of claim 16 wherein the pickup slots are apertures which extend through the sleeve-like drum.

18. The device of claim 13 wherein the drum shaft is in an essentially horizontal direction.

19. The device of claim 13 further comprising a ram arrangement comprising a plurality of rams at the component discharge, said rams being movable radially to the drum shaft between a starting position, in which the rams lie within the region enclosed by the drum, and a working position, in which the rams extend through the pickup slots into the region of the tape.

20. The device of claim 19 wherein a plurality of the rams of the ram arrangement are movable jointly by a single ram drive.

21. The device of claim 13 further comprising a discard station in the path of rotation of the drum, said discard station having means to selectively remove individual components from each group of pickup slots.

22. The device of claim 21 wherein the discard station is positioned after the component discharge.

23. The device of claim 21 wherein at least the part of the drum having the pickup slots is surrounded, between the component discharge and the component intake, by a guide surface which retains the components in the pickup slots.

24. The device of claim 23 wherein the means for the selective removal of components at the discard station is formed by apertures in the guide surface.

25. The device of claim 24 further comprising selectively controllable slides which cover the apertures.

26. The device of claim 25 wherein the slides are tensioned by springs.

27. The device of claim 21 further comprising a test station for the components.

28. The device of claim 21 wherein the test station is in the path of rotation of the drum between the component intake and the component discharge.

29. The device of claim 28 further comprising means such that whenever a group of pickup slots reaches the component discharge, whose slots are filled exclusively with non-defective components, the components of all pickup slots are inserted into depressions in the tape, and whenever a group of pickup slots reaches the component discharge, in which the group includes at least one defective component, the actuating means for the rams is not actived.

30. The device of claim 29 wherein the group including the at least one defective component is transported to the discard station and further comprising means for ejecting the defective component from its pickup slot.

31. The device of claim 13 wherein the means for multiple-path feeding of the components comprises channels on a vibrating table.

32. The device of claim 31 wherein the channels at one end extend to the area for insertion of the components and further comprising at least one brush movable transverse to the direction of the channels at said one end.

33. The device of claim 32 wherein the at least one brush is mounted on and rotatable about a shaft which is perpendicular to the plane of the multiple-path feed.

34. The device of claim 13 further comprising a plurality of channels at the component discharge for insertion of components from the drum.

35. The device of claim 33 further comprising means to insert the components from the channels into the depressions of the tape.

36. The device of claim 35 wherein the means for the insertion of components into the depressions comprises at least one displaceable diaphragm selectively operable between a first position which shuts off the channel at its underside and a second position which exposes an aperture on the underside of the channel over an available depression of the tape.

37. The device of claim 13 wherein the structural components are selected from the group consisting of electrical components, microchips and MELF's.

* * * * *

UNITED STATES PATENT AND TRADEMARK OFFICE
CERTIFICATE OF CORRECTION

PATENT NO.  : 5,131,206
DATED       : July 21, 1992
INVENTOR(S) : Georg Sillner

It is certified that error appears in the above-indentified patent and that said Letters Patent is hereby corrected as shown below:

Column 14, Claim 28, line 1, change "claim 21" to claim 27--.

Column 14, Claim 29, last line, change "actived" to --activated--.

Signed and Sealed this

Seventeenth Day of August, 1993

*Attest:*

BRUCE LEHMAN

*Attesting Officer*    *Commissioner of Patents and Trademarks*